(12) United States Patent
Weber et al.

(10) Patent No.: US 6,800,887 B1
(45) Date of Patent: Oct. 5, 2004

(54) NITROGEN CONTROLLED GROWTH OF DISLOCATION LOOP IN STRESS ENHANCED TRANSISTOR

(75) Inventors: Cory E. Weber, Hillsboro, OR (US); Mark Armstrong, Portland, OR (US); Harold Kennel, Beaverton, OR (US); Tahir Ghani, Portland, OR (US); Paul A. Packan, Beaverton, OR (US); Scott Thompson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/405,110

(22) Filed: Mar. 31, 2003

(51) Int. Cl.[7] .................. H01L 29/80; H01L 31/112
(52) U.S. Cl. ........................... 257/285; 257/287
(58) Field of Search .................. 257/285, 287, 257/220, 218, 221

(56) References Cited

U.S. PATENT DOCUMENTS

| 5,266,816 A | * | 11/1993 | Seto et al. ............... 257/65 |
| 5,792,699 A | * | 8/1998 | Tsui ....................... 438/290 |
| 5,895,954 A | * | 4/1999 | Yasumura et al. ........ 257/345 |

* cited by examiner

*Primary Examiner*—Phat X. Cao
(74) *Attorney, Agent, or Firm*—Blakely, Sokoloff, Taylor & Zafman LLP

(57) ABSTRACT

Known techniques to improve metal-oxide-semiconductor field effect transistor (MOSFET) performance is to add a high stress dielectric layer to the MOSFET. The high stress dielectric layer introduces stress in the MOSFET that causes electron mobility drive current to increase. This technique increases process complexity, however, and can degrade PMOS performance. Embodiments of the present invention create dislocation loops in the MOSFET substrate to introduce stress and implants nitrogen in the substrate to control the growth of the dislocation loops so that the stress remains beneath the channel of the MOSFET.

5 Claims, 6 Drawing Sheets

NITROGEN CONTROLLED GROWTH OF DISLOCATION LOOP IN STRESS ENHANCED TRANSISTOR

BACKGROUND

1. Field

Embodiments of the present invention relate to transistors, and in particular to improving the speed of transistors.

2. Discussion of Related Art

A typical metal-oxide-semiconductor field effect transistor (MOSFET) has a gate, a drain, and a source formed in or on a semiconductor wafer. When a voltage $V_g$ is applied to the gate that is greater than the threshold voltage $V_t$ of the transistor, the transistor turns on and current flows in a conducting layer formed below the gate and between the source and drain. When the voltage $V_g$ applied to the gate that is less than the threshold voltage $V_t$ of the transistor, the transistor turns off and current stops flowing in the channel. The current that flows in the channel is the drive current $I_D$, sometimes called saturation drive current or linear drive current. In the MOSFET equation, saturation drive current (ID) is expressed by $$I_D = W/L \; \mu \; C_{ox}(V_g - V_t)^2$$

where W is the width of the gate, L is the length of the gate, $C_{ox}$ is the gate capacitance, $V_g$ is the gate voltage, $V_t$ is the threshold voltage for the transistor, $\mu$ is electron mobility in the channel, in percent change. As the equation indicates, as the electron mobility increases, drive current increases.

MOSFETS can be either n-type metal oxide semiconductor (NMOS) transistors or p-type metal oxide semiconductor (PMOS) transistors and usually a combination of NMOS transistors and PMOS transistors are present in a single integrated circuit device. Integrated circuit technology is advancing at a rapid pace and transistor technology must keep up.

One method for improving NMOS transistor performance is to add a layer of high stress dielectric material to the transistor. Adding a layer of high stress dielectric material to the transistor introduces stress in the device. Introducing stress by adding a layer of high stress dielectric material to the transistor increases electron mobility in the transistor. Increasing electron mobility causes transistor drive current to improve. This technique, i.e., adding a layer of high stress dielectric material, increases transistor fabrication process complexity, however, and can degrade PMOS transistor performance.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
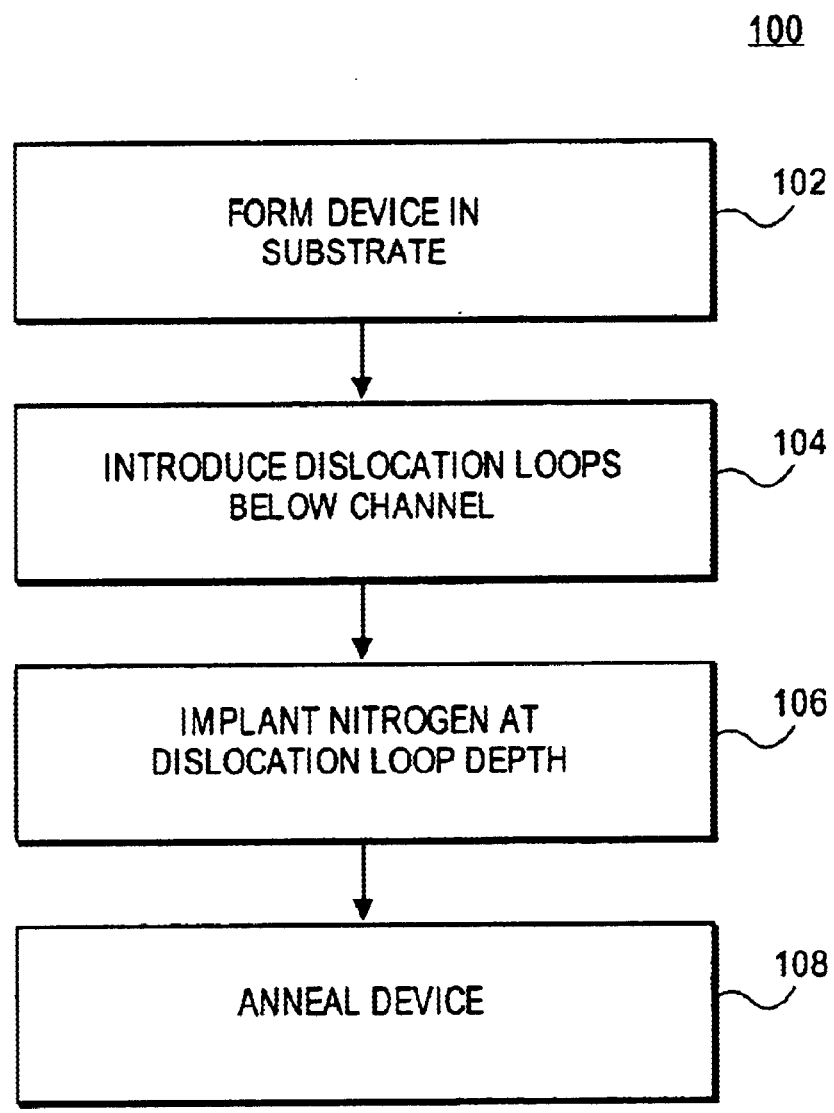
FIG. 1 is a flowchart illustrating a process for fabricating one or more semiconductor transistors on a wafer according to an embodiment of the present invention.

Embodiments of the present invention are directed to a MOSFET having nitrogen controlled dislocation loops in the transistor substrate below the conducting channel to enhance electron mobility and improve drive current of the transistor. FIG. 1 is a flowchart illustrating a process 100 for fabricating one or more semiconductor transistors on a wafer according to an embodiment of the present invention. A machine-readable medium with machine-readable instructions thereon may be used to cause a processor to perform the process 100. Of course, the process 100 is only an example process and other processes may be used. The process may be used on batches of wafers or on individual wafers.

In a block 102, a transistor may be formed in or on a semiconductor substrate. The transistor may be an n-type metal-oxide-semiconductor field effect transistor (MOSFET) transistor. The substrate may be a single crystal substrate.

In one embodiment, the transistor may include a source formed in or on the substrate, a drain formed in or on the substrate, a gate dielectric layer formed on the silicon substrate, a gate electrode formed on the gate dielectric layer, two dielectric spacers formed on the sides of the gate dielectric layer and the gate electrode, dielectric shallow trench isolation (STI) regions formed in the wafer. The source may have a tip implant and the drain may have a tip implant. The substrate may have a well. The source, drain, gate, gate dielectric layer, spacers, STI regions, and well may be fabricated using well-known and/or proprietary techniques. When operating, the transistor includes a conducting channel beneath the gate electrode or gate dielectric layer and between the source and the drain.

In a block 104, dislocation loops may be introduced into the substrate (e.g., doping) below the channel to increase percent electron mobility in the channel. Dislocation loops may be introduced by implanting high dose silicon after gate patterning and immediately before the tip implantation using conventional MOSFET processing.

In one embodiment, the substrate is doped using ion implantation (e.g., Si thirty-five kilo electron volts (35 keV); $10^{15}$ atoms/cm$^2$). After annealing, extra silicon atoms from the implant create a disk of extra Si atoms that displace nearby Si atoms in the substrate and interrupt the periodicity of the crystal lattice. This displacement may be called a "dislocation loop" and creates a compressive stress in the substrate.

In one embodiment, the surface normal to the disk may have a component in the "y" direction of the substrate plane. The "y" direction is sometimes called the "vertical" direction or the direction perpendicular to the substrate plane. When the surface normal to the dislocation loop is tilted in the "y" direction the compressive stress oriented in the y direction propagates in the "y" direction. Compressive stress oriented in the "y" direction increases electron mobility in the charnel and thus increases drive current. This is because only compressive stress oriented in the 'Y' direction propagates up to the channel.

The surface normal to the dislocation loop also may have components in the "x" direction and/or the "z" direction. When surface normal to the dislocation loop is tilted in the "x" direction compressive stress oriented in the x direction propagates in the "x" direction. When surface normal to the dislocation loop is tilted in the "z" direction compressive stress oriented in the z direction propagates in the "z" direction. Compressive stresses oriented in the "x" or "z" direction degrade electron mobility and thus decrease drive current. However, compressive stresses from the loop oriented in the "x" or "z" direction have little effect on electron mobility and drive current as long as the dislocation loop is located below the channel. This is because as long as the dislocation loop remains below the channel, the compressive stresses oriented in the "x" or "z" direction do not propagate up to or into the channel; they only propagate in the "x" or "z" directions. Only the compressive stresse oriented in the 'y' direction propagates up to the channel.

Alternatively, high dose silicon implantation and annealing may be accomplished before the gate deposition. This alternative process creates dislocation loops along the length of the channel.

Figure 2:
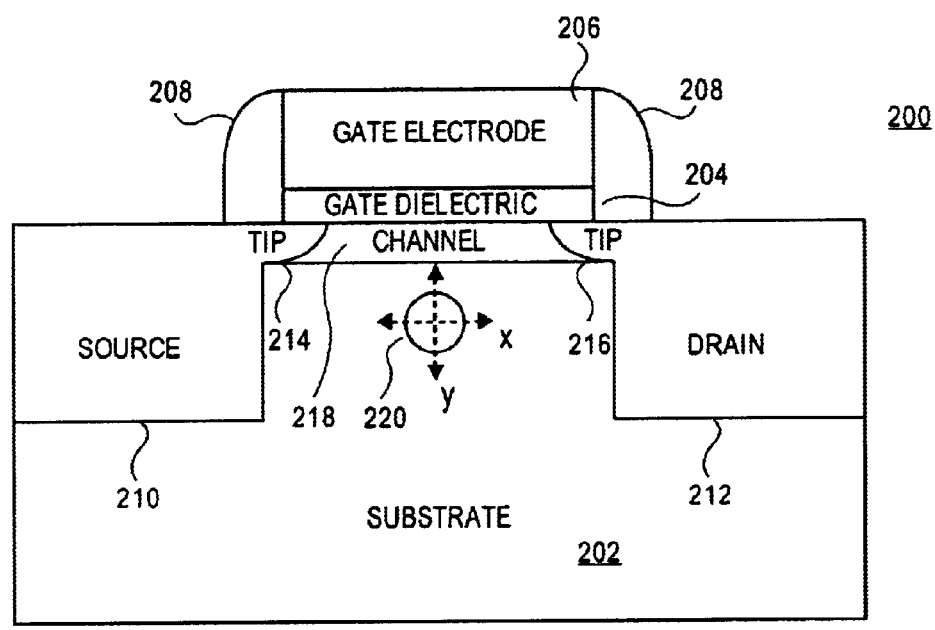
FIG. 2 is a cross-sectional view of a device fabricated according to embodiments of the present invention.

FIG. 2 is a cross-sectional view of a device 200 fabricated according to embodiments of the present invention. The device 200 may be an NMOS transistor that includes a substrate 202, a gate dielectric layer 204 formed on the substrate 202, a gate electrode 206 formed on the gate dielectric layer 204, two vertical sidewall dielectric spacers 208 formed on the sides of the gate dielectric layer 204 and the gate electrode 206, a source 210 and a drain 212 formed in the substrate 202, and source and drain tips 214 and 216, respectively, formed in the substrate 202.

When operating, the device 200 includes a channel 218. In one embodiment of the present invention, there may be one or more dislocation loops 220 (only one is shown) in the substrate 202 just below the channel 218, or where the channel 218 would be when the device 200 is operating. The distance from the center of mass of a dislocation loop 220 and the channel 218 may be termed "loop depth," and the loop depth may be fixed. In one embodiment, the loop depth may be approximately 250 Å.

Figure 3:
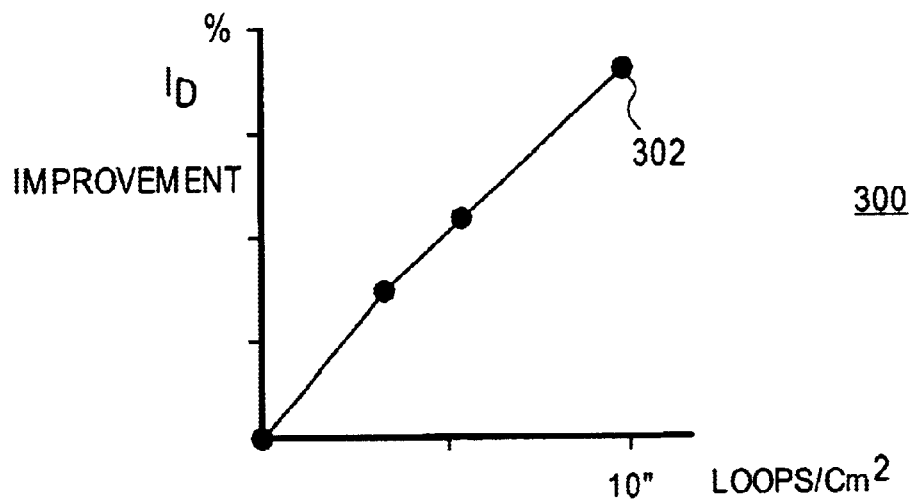
FIG. 3 is a graphical representation of drive current improvement versus density of dislocation loops according to embodiments of the present invention.

As the density of dislocation loops 220 increases, the compressive stress felt in the "y" direction increases, the percent electron mobility increases, and the drive current of the device 200 increases. FIG. 3 is a graphical representation 300 of drive current improvement (in percent (%) improvement) as it relates to the density of dislocation loops 220 (in dislocation loops per cm$^2$) according to an embodiment of the present invention.

As the graphical representation 300 illustrates where there are no dislocation loops 220, i.e., the density of dislocation loops 220 in the substrate 202 is zero, there is no improvement in drive current. As the dislocation loop 220 density increases, the drive current steadily improves. A point 302 represents a density of dislocation loops 220 of approximately $10^{11}$ loops per cm$^2$ and a corresponding drive current improvement of approximately eighteen percent. In this embodiment, it is assumed that each dislocation loop has a radius of approximately 162 Å.

Figure 4:
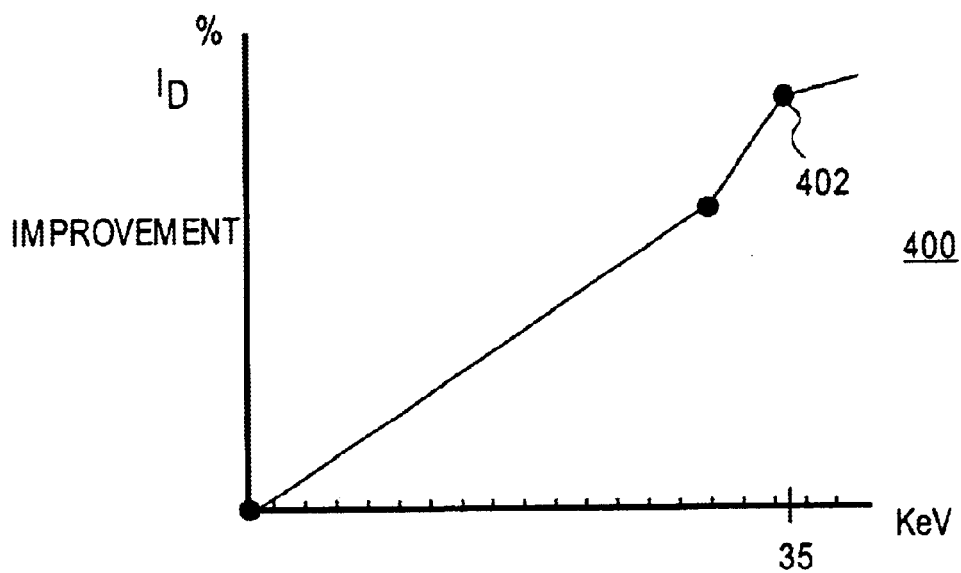
FIG. 4 is a graphical representation of drive current improvement versus the energy level used to implant Si in a substrate to create the dislocation loops according to embodiments of the present invention.

As the energy used to implant Si to create the dislocation loops 220 increases, the density of dislocation loops increases, the compressive stress is felt in the "y" direction increases, the percent electron mobility increases, and the drive current of the device 200 increases. FIG. 4 is a graphical representation 400 of drive current improvement (in percent (%) improvement) as it relates to the energy level (in keV) used to implant Si in the substrate 202 to create the dislocation loops 220 according to an embodiment of the present invention.

The graphical representation 400 illustrates that as the energy level used to implant Si in the substrate 202 increases, the drive current steadily improves. A point 402 represents an energy level of approximately thirty-five keV and a corresponding drive current improvement of approximately nine percent when there are approximately $10^{15}$ Si atoms per cm$^2$ being implanted in the substrate 202.

Figure 5:
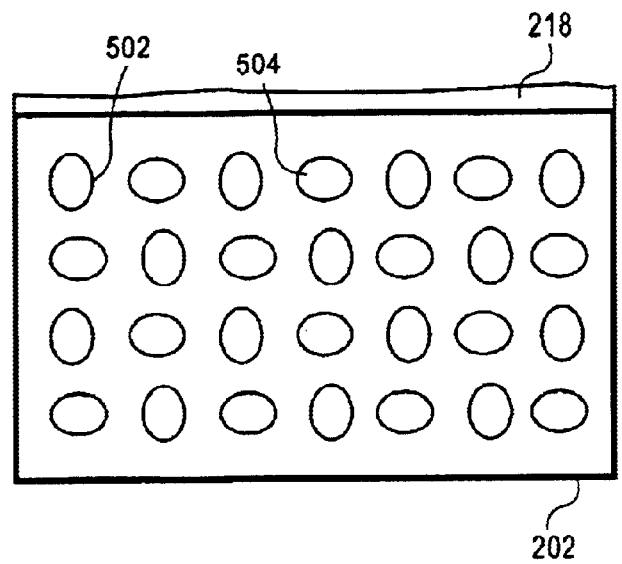
FIG. 5 shows a substrate with several small dislocation loops according to an embodiment of the present invention.

FIG. 5 shows the substrate 202 with several small dislocation loops 502 and 504 according to an embodiment of the present invention. In the embodiment shown, there are twenty-eight dislocation loops: fourteen dislocation loops 502 tilted (largely) in the "y-x" direction and fourteen dislocation loops 504 tilted (largely) in the "y-z" direction. The dislocation loops 502 tilted in the "y-x" direction create compressive stress in the "y" and "x" directions. The dislocation loops 504 tilted in the "y-z" direction create compressive stress in the "y" and "z" direction The radius of each dislocation loop may be approximately 200 angstroms (Å). As described above, compressive stresses from the loops in the "x" (or "z") direction have little effect on electron mobility and drive current as long as the dislocation loops are located below the channel.

In conventional semiconductor fabrication processing, the device 200 may have to be subject to one or more thermal processes, such as rapid thermal anneal. Annealing tends to cause dislocation loops to grow and annealing processes tend to have a cumulative effect on dislocation loop growth.

As the radius of a dislocation loop increases the percent electron mobility increases, and the drive current of the device 200 increases until a dislocation loop grows so large that it enters the channel 218. When a dislocation loop grows so large that it enters the channel 218 the compressive stresses in the "x" or "z" direction have a significant negative effect on electron mobility and drive current, however (i.e., compressive stresses in the "x" or "z" direction begin degrade electron mobility and decrease drive current). A dislocation loop also can grow so large that it shorts the source 210 and drain 212.

Figure 6:
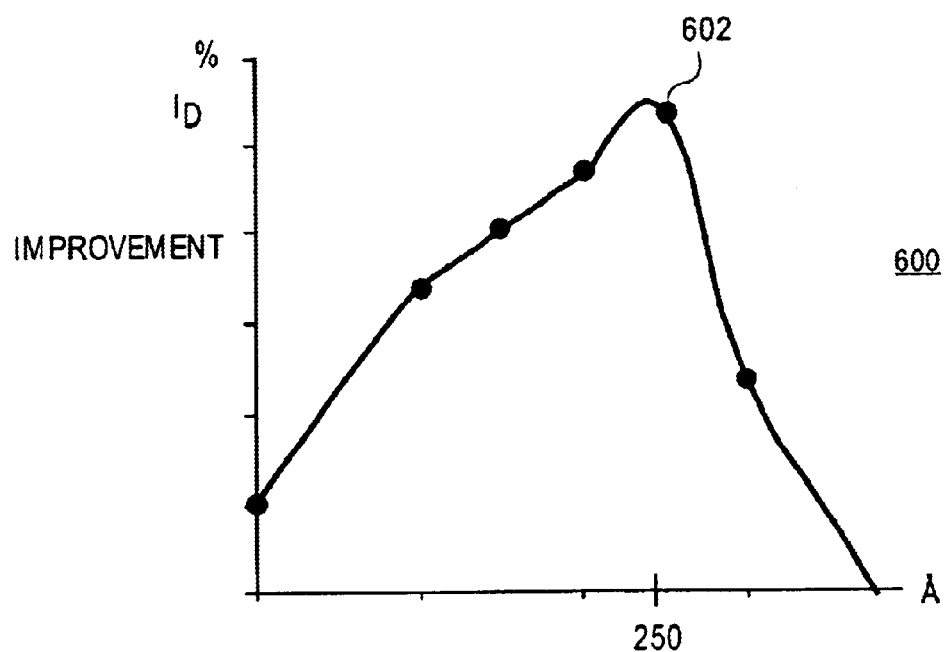
FIG. 6 is a graphical representation of drive current improvement versus dislocation loop radius according to an embodiment of the present invention.

FIG. 6 is a graphical representation 600 of drive current improvement (in percent (%) improvement) as it relates to dislocation loop radius (in angstroms (Å)) according to an embodiment of the present invention. A point 602 illustrates that as dislocation loop radius increases drive current increases for dislocation loop depths of approximately 250 Å. For smaller radii the graphical representation 600 shows a significant increase in drive current, as increased compressive stress in the "y" direction improves the electron mobility. However, as dislocation loop size continues to increase, the dislocation loop eventually strikes the channel 218, and the "x" and/or "z" directed compressive stress fields degrade electron mobility and thus drive current, as indicated by the graphical representation rapidly falling off after the point 602.

Figure 7:
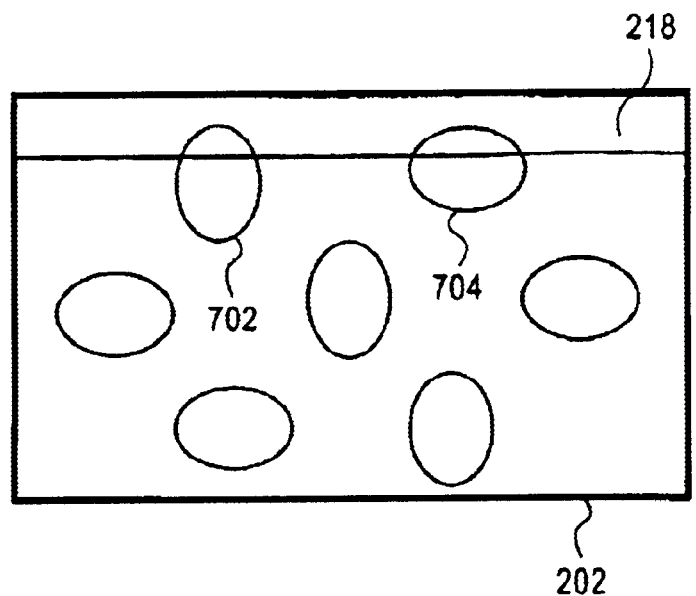
FIG. 7 shows a substrate with several large dislocation loops after growth due to thermal processing according to an embodiment of the present invention.

FIG. 7 shows the substrate 202 with several large dislocation loops after growth due to thermal processing according to an embodiment of the present invention. In the embodiment shown, there are seven dislocation loops: three dislocation loops 702 tilted (largely) in the "y-z" direction and four dislocation loops 704 tilted (largely) in the "y-x" direction. The dislocation loops 702 tilted in the "y-x" direction create compressive stress in the "y" and "x" directions. The dislocation loops 704 tilted in the "y-z" direction create compressive stress in the 'y' and "z" direction.

The radius of each dislocation loop may be approximately 400 angstroms (Å). The total area occupied by all of the dislocation loops is not increased. If these loops are at depths smaller than the loop radius, the dislocation loops 702 and 704 extend into the channel 218 and the compressive stresses in the "x" (or "z") direction have a significant negative effect on electron mobility and drive current.

Referring back to FIG. 1, rather than allowing thermal processes to cause the dislocation loops to enter the channel 218, in a block 106, nitrogen (Ni) may be introduced into the substrate 202 (e.g., doping) below the channel 218 at loop depth prior to subjecting the device 200 to one or more thermal processes. In one embodiment, the substrate is doped with N using ion implantation. The N attaches to the perimeter of (or "decorates") the dislocation loops 502 and 504 to control the growth of the dislocation loops 502 and 504 during one or more thermal processes. In one embodiment of the present invention, sufficient N is implanted to allow the dislocation loops 502 and 504 to propagate up to the channel 218 but not into the channel 218 (e.g., N 18 keV; $5 \times 10^{14}$ atoms/cm$^2$).

Figure 8:
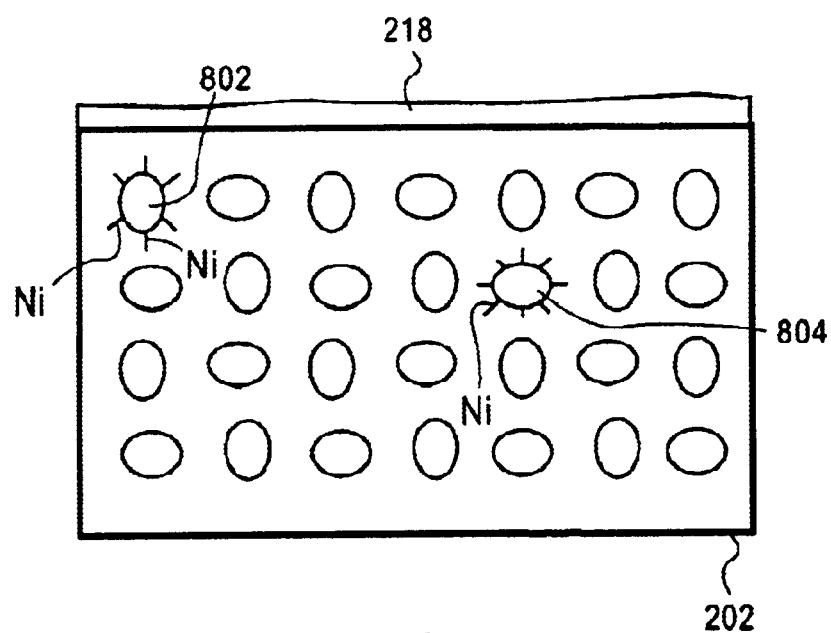
FIG. 8 shows a substrate with several small dislocation loops after a substrate is doped with N using ion implantation according to an embodiment of the present invention.

FIG. 8 shows the substrate 202 with several small dislocation loops 802 and 804 underneath the channel 218 after the substrate is doped with N using ion implantation before being subject to thermal processes according to an embodiment of the present invention. In the embodiment shown, there are twenty-eight dislocation loops: fourteen dislocation loops 802 tilted (largely) in the "y-x" direction and fourteen dislocation loops 804 tilted (largely) in the "y-z" direction. The dislocation loops 802 and 804 are decorated with N.

The radius of each dislocation loop may be approximately 200 angstroms (Å).

In a block 108, the device 200 is annealed. In an embodiment of the present invention, annealing is accomplished using a rapid thermal process such as rapid thermal anneal (RTA). The annealing temperature may be up to and around approximately nine hundred degrees C. or more and may last for one to five minutes or more. Additional anneals may be performed.

Figure 9:
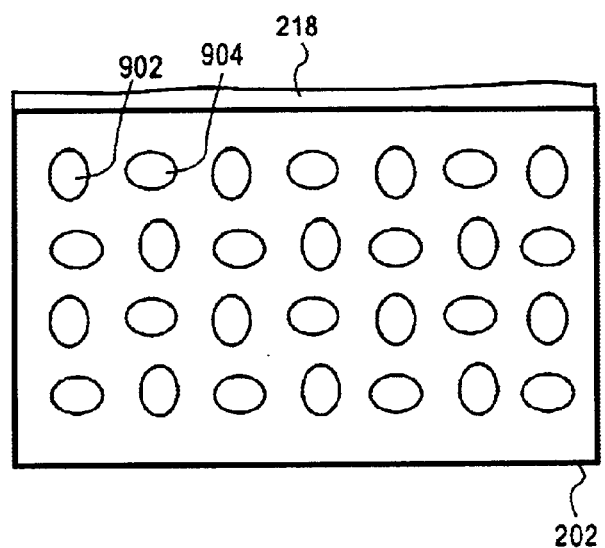
FIG. 9 shows a substrate with several small dislocation loops after the substrate is subject to one or more thermal processes according to an embodiment of the present invention.

FIG. 9 shows the substrate 202 with several small dislocation loops 902 and 904 underneath the channel 218 after the substrate 202 is subject to one or more thermal processes according to an embodiment of the present invention. In the embodiment shown, there remain twenty-eight dislocation loops: fourteen dislocation loops 902 tilted (largely) in the "y-x" direction and fourteen dislocation loops 904 tilted (largely) in the "y-z" direction.

The size of each dislocation loop is not significantly affected by being subjected to thermal processes. For example, the dislocation loops 902 and 904 may have radii of approximately 200 angstroms (Å).

Figure 10:
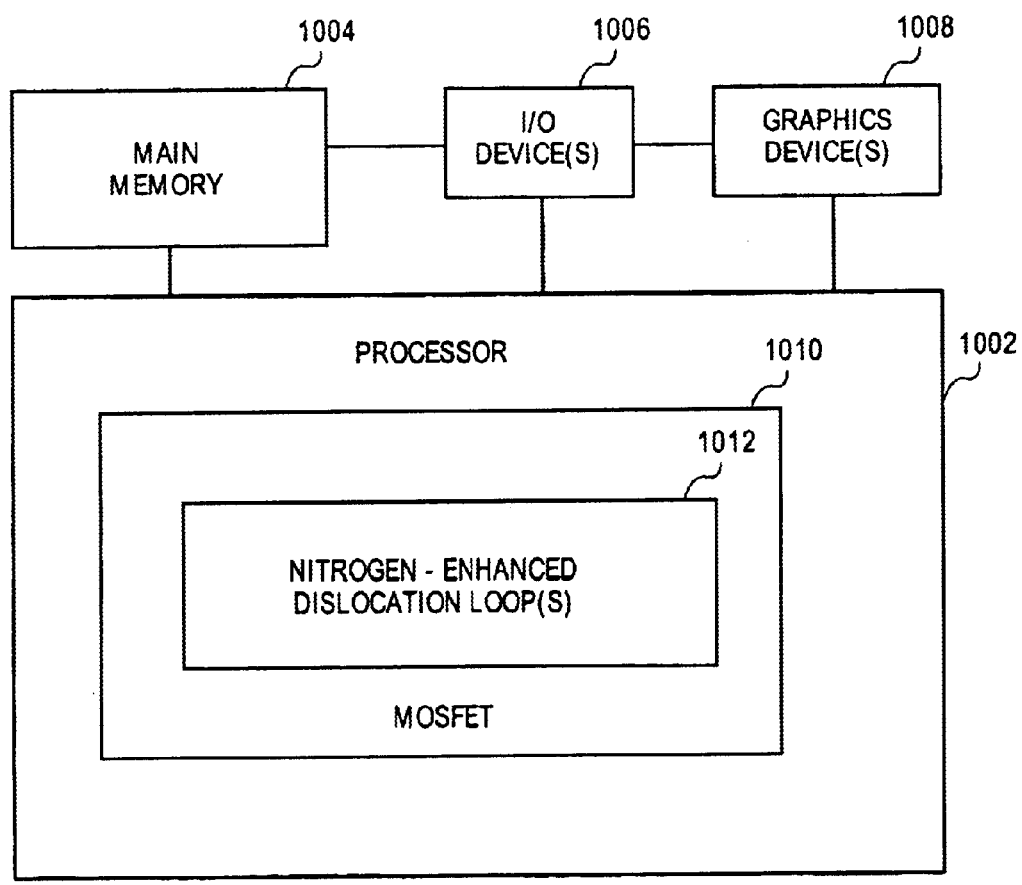
FIG. 10 is a high-level block diagram of a computer system according to an embodiment of the present invention.

FIG. 10 is a high-level block diagram of a computer system 1000 according to an embodiment of the present invention. The system 100 includes a processor 1002, a main memory 1004, input/output (I/O) device(s) 1006, and a graphics device(s) 1008. The main memory 1004 is coupled to the processor 1002 and the I/O devices 1006. The I/O device(s) 1006 are further coupled to the graphics device(s) 1008 and the processor 1002. The graphics device(s) 1008 are further coupled to the processor 1002.

In one embodiment of the present invention, the processor 1002 includes a MOSFET 1010, which may include one or more nitrogen-enhanced dislocation loops 1012 implanted according to embodiments of the present invention in it substrate (not shown).

The main memory 1004 performs its conventional functions of storing data (pixels, frames, audio, video, etc.) and software (control logic, instructions, code, computer programs, etc.) for access by other system components. In general, the main memory 1004 includes several data lines corresponding to several addressable storage locations. In one embodiment, each data line handles eight data words (or sixty-four bytes). In another embodiment, each data line handles sixteen data words (or 128 bytes). Memory technology is well known, and suitable memory can be a random access memory (RAM) available from Rambus Inc., in Mountain View Calif., such as Rambus® Dynamic RAM (RDRAM).

The I/O device(s) 1006 typically are peripheral components or devices, such as printers, local disk drives, compact disk (CD) ROMs, local area networks (LANs), sound modules, small computer system interfaces (SCSI), etc. The I/O devices 1006 generally have I/O drivers, which read and write to memory for the I/O devices 1006. I/O devices are well known.

The graphics device(s) 1008 is, in general, a screen that displays images. Typical images include three-dimensional images, animation effects, video, text, etc. Graphics device technology is also well known, and thus, will not be described in any further detail.

Embodiments of the present invention are directed to forming NMOS transistors on a substrate. In alternative embodiments, a second transistor may be formed in or on the substrate. The second transistor may be a p-type MOS (PMOS) transistor having a source region, a drain region, a gate region, and a conducting channel. When silicon is implanted in the substrate, the percent electron mobility in the PMOS conducting channel remains substantially unchanged.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms used in the following claims should not be construed to limit the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:

a transistor formed in or on a semiconductor substrate, the transistor having a source region, a drain region, and a gate region, and a conducting layer below the gate region and between the source region and the drain region;

a silicon implant introducing dislocation loops in the semiconductor substrate at a depth below the conducting layer, and a nitrogen implant introduced in the semiconductor substrate with projected range at a depth below the conducting layer.

2. The apparatus of claim 1, wherein the silicon implant introduced in the semiconductor substrate at a depth below the conducting layer is to create a dislocation loop.

3. The apparatus of claim 1, wherein the transistor is an n-type metal oxide semiconductor (NMOS) transistor.

4. The apparatus of claim 1, further comprising a first spacer formed on the semiconductor substrate between the gate region and the source region.

5. The apparatus of claim 4, further comprising a second spacer formed on the semiconductor substrate between the gate region and the drain region.

* * * * *

UNITED STATES PATENT AND TRADEMARK OFFICE
CERTIFICATE OF CORRECTION

PATENT NO. : 6,800,887 B1
DATED : October 5, 2004
INVENTOR(S) : Weber et al.

It is certified that error appears in the above-identified patent and that said Letters Patent is hereby corrected as shown below:

Column 3,
Line 13, delete "charnel" and insert -- channel --.

Signed and Sealed this

Fifth Day of July, 2005

JON W. DUDAS
*Director of the United States Patent and Trademark Office*